(12) United States Patent
Kwon

(10) Patent No.: US 8,687,408 B2
(45) Date of Patent: Apr. 1, 2014

(54) HIGHLY INTEGRATED PROGRAMMABLE NON-VOLATILE MEMORY AND MANUFACTURING METHOD THEREOF

(75) Inventor: Euipil Kwon, San Jose, CA (US)

(73) Assignee: Rangduru, Inc., San Jose, CA (US)

( * ) Notice: Subject to any disclaimer, the term of this patent is extended or adjusted under 35 U.S.C. 154(b) by 62 days.

(21) Appl. No.: 13/614,242

(22) Filed: Sep. 13, 2012

(65) Prior Publication Data

US 2013/0077381 A1    Mar. 28, 2013

(30) Foreign Application Priority Data

Sep. 23, 2011  (KR) .......................... 10-2011-0096072

(51) Int. Cl.
*G11C 11/00* (2006.01)
*G11C 5/02* (2006.01)
*G11C 13/00* (2006.01)

(52) U.S. Cl.
CPC .............. *G11C 5/02* (2013.01); *G11C 13/0069* (2013.01)
USPC ............................................ 365/148; 365/51

(58) Field of Classification Search
CPC ............................. G11C 5/02; G11C 13/0069
USPC ..................................................... 365/148, 51
See application file for complete search history.

(56) References Cited

U.S. PATENT DOCUMENTS

| | | | |
|---|---|---|---|
| 8,264,018 B2 * | 9/2012 | Yoon et al. ..................... | 257/278 |
| 8,363,481 B2 * | 1/2013 | Kidoh et al. .............. | 365/185.23 |
| 8,559,235 B2 * | 10/2013 | Yoon et al. .............. | 365/185.29 |
| 8,598,005 B2 * | 12/2013 | Chan et al. ..................... | 438/301 |

* cited by examiner

*Primary Examiner* — Michael Tran
(74) *Attorney, Agent, or Firm* — Staas & Halsey LLP

(57) ABSTRACT

A highly integrated programmable non-volatile memory and a manufacturing method thereof are provided. More particularly, a memory device including an antifuse and a diode, or a variable resistor and a diode, an operation method thereof, and a manufacturing method of a plurality of memory cells capable of increasing the integration density by utilizing a vertical space are provided. The highly integrated programmable non-volatile memory includes first stepped cells and second stepped cells formed to have different heights. The first stepped cells are formed on a horizontal plane with a high height, and the second stepped cells are formed on a horizontal plane with a low height.

11 Claims, 16 Drawing Sheets

140

HIGHLY INTEGRATED PROGRAMMABLE NON-VOLATILE MEMORY AND MANUFACTURING METHOD THEREOF

CROSS-REFERENCE TO RELATED APPLICATION

This application claims priority from Korean Patent Application No. 10-2011-0096072 filed on Sep. 23, 2011 in the Korean Intellectual Property Office, and all the benefits accruing therefrom under 35 U.S.C. 119, the contents of which in its entirety are herein incorporated by reference.

BACKGROUND

1. Technical Field

The present inventive concept relates to a highly integrated programmable non-volatile memory and a manufacturing method thereof, and more particularly to a memory device including an antifuse and a diode, or a variable resistor and a diode, an operation method thereof, and a manufacturing method of a plurality of memory cells capable of increasing the integration density by utilizing a vertical space.

2. Description of the Related Art

As a conventional technology, Korean Patent Registration No. 0904771 relates to a three-dimensional integrated circuit structure and a manufacturing method thereof, and discloses a three-dimensional IC structure including a single crystalline semiconductor layer having a plurality of devices, one or more insulating layers in contact with the top and bottom of the single crystalline semiconductor layer, and wiring and connection lines provided in the insulating layers, the wiring and connection lines directly or indirectly connecting the plurality of devices.

Also, as a conventional technology, Korean Patent Publication No. 1997-0067848 relates to a semiconductor memory device and a manufacturing method thereof, and discloses a semiconductor memory device including an access transistor T which accesses information of word lines, a storage node capacitor C which stores information through bit lines as the access transistor T operates, and a charge-up transistor P which supplies charges to the storage node capacitor, thereby consistently supplying charges to the storage node capacitor, and improving the processing speed of the semiconductor memory device.

In general, a non-volatile semiconductor memory is a semiconductor memory which can continuously maintain the information stored in the memory cell even though power is not supplied.

The non-volatile memory related to the present invention includes memory cells which are configured such that an intermediate layer between a first electrode and a second electrode is an insulating layer or variable resistor.

In the case where the intermediate layer forming the memory cells is an insulating layer, when a breakdown is caused by applying a high voltage for programming to both electrodes, i.e., the first electrode and the second electrode between which the insulating layer is interposed, a resistive path is created, and the insulating layer is changed from an insulating state to a conducting state. The insulating layer becomes an antifuse element.

In this regard, the following definition can be made. If the insulating layer is in the conducting state, programming has been performed and the data '0' is stored. If the insulating layer is in the insulating state, programming has not been performed, and the data '1' is stored.

In the case where the intermediate layer forming the memory cells is a variable resistor, as the variable resistor, a resistance change material or a phase change material can be used.

In the case where the variable resistor forming the memory cells is made of a resistance change material, if a voltage equal to or greater than a set voltage is applied to both electrodes, i.e., the first electrode and the second electrode between which the variable resistor is interposed, the resistance of the variable resistor has a low state. If a voltage equal to or greater than a reset voltage is applied to both electrodes, the resistance of the variable resistor has a high state. It can be defined that the data '1' is stored if the resistance of the variable resistor has a low state, and the data '0' is stored if the resistance of the variable resistor has a high state.

As the resistance change material, various materials such as perowvskite, transition metal oxide, and chalcogenide may be used.

The memory using the resistance change material can be classified into several types depending on the material. Firstly, a material such as a colossal magnetoresistance (CMR) material and $Pr_{1-x}Ca_xMnO_3$(PCMO) may be inserted between the electrodes, thereby using a change in resistance due to the electric field. Secondly, binary oxide such as $Nb_2O_5$, $TiO_2$, NiO and $Al_2O_3$ may be fabricated to have a non-stoichiometric composition and used as the resistance change material. Thirdly, as a chalcogenide material, a resistance difference due to a change in the threshold voltage of an Ovonic switch can be used while maintaining an amorphous structure without phase change by flowing a high current as in a phase change RAM (PRAM). Fourthly, the state of the resistance may be changed by doping chromium (Cr) or niobium (Nb) in a ferroelectric material such as $SrTiO_3$ and $SrZrO_3$. Finally, there is a programmable metallization cell (PMC) in which two states of the resistance are formed according to the presence or absence of a conductive channel in a medium due to an electrochemical reaction by doping silver (Ag) having a large ion mobility in a solid electrolyte such as GeSe. Other materials having memory characteristics through stable implementation of two resistor states or processing methods have been reported.

In the case where the variable resistor forming the memory cells is made of a phase change material, it can be defined that the data '1' is stored if the resistance of the phase change material has a low state, and the data '0' is stored if the resistance of the phase change material has a high state.

The phase change material is a material whose phase is changed to a crystalline or amorphous state by a constant current. The crystalline state corresponds to a low resistance state, and the amorphous state corresponds to a high resistance state.

Since memory cells are arranged in rows and columns to form a memory array, a transistor or diode should be included to selectively access the memory cell.

In order to increase the integration density in the current memory devices, a microprocessing technology has been developed such that more memory cells can be integrated in a horizontal structure.

However, the horizontal structure according to the conventional technology has to now depend on the microprocessing technology with physical limits to the integration density.

Thus, there is a need for a new structure capable of easily increasing the integration density instead of the conventional horizontal structure, and a new manufacturing method thereof.

SUMMARY

The present invention provides a semiconductor memory device including a memory cell configured to include an antifuse and a diode, or a variable resistor and a diode, and an operation method thereof.

The present invention also provides a structure capable of utilizing a vertical space in order to increase the integration density when forming a plurality of memory cells, and a manufacturing method thereof.

The objects of the present invention are not limited thereto, and the other objects and advantages of the present invention will be described in or be apparent from the following description of the embodiments. Also, it can be easily seen that the objects and advantages of the present invention can be realized by the means shown in claims and a combination thereof.

According to an aspect of the present invention, there is provided a highly integrated programmable non-volatile memory comprising: first stepped cells and second stepped cells formed on a semiconductor substrate to have different heights, wherein each of the first stepped cells and the second stepped cells is configured to have one of a stack structure including a conductive layer (first electrode), a variable resistor, a metal layer (second electrode) and a semiconductor layer, a stack structure including a conductive layer (first electrode), a variable resistor and a semiconductor layer (second electrode), a stack structure including a conductive layer (first electrode), an insulating layer, a metal layer (second electrode) and a semiconductor layer, and a stack structure including a conductive layer (first electrode), an insulating layer and a semiconductor layer (second electrode), and wherein the first stepped cells are formed on a horizontal plane with a high height, and the second stepped cells are formed on a horizontal plane with a low height.

In the stack structure including a conductive layer (first electrode), a variable resistor and a semiconductor layer (second electrode), or the stack structure including a conductive layer (first electrode), an insulating layer and a semiconductor layer (second electrode), the semiconductor layer may include a P-N junction diode structure.

In the stack structure including a conductive layer (first electrode), a variable resistor and a semiconductor layer (second electrode), or the stack structure including a conductive layer (first electrode), an insulating layer and a semiconductor layer (second electrode), if the variable resistor or insulating layer is in a conducting state, the conductive layer and the semiconductor layer may become a Schottky diode structure.

The first stepped cells are formed on a surface of the semiconductor substrate, and the second stepped cells are formed on bottom surfaces of trenches.

The first stepped cells and the second stepped cells are configured to be adjacent to each other, or a structure in which first stepped cells and the second stepped cells are adjacent to each other is repeated.

The first stepped cells and the second stepped cells include a stack structure including a conductive layer (first electrode), an intermediate layer, a metal layer (second electrode) and a semiconductor layer, or a stack structure including a conductive layer (first electrode), an intermediate layer and a semiconductor layer (second electrode).

The intermediate layer is a data storage area, and is configured as an insulating layer or variable resistor. Hereinafter, for simplicity, a configuration in which the intermediate layer is an insulating layer is referred to as A-type, and a configuration in which the intermediate layer is a variable resistor is referred to as B-type.

Sidewall spacers are formed at sidewalls between the first stepped cells and the second stepped cells in order to prevent interference due to the variable resistor or insulating layer interposed between the first electrode and the semiconductor substrate in the first stepped cells and the second stepped cells, or suppress generation of a parasitic transistor in a region between the first stepped cells and the second stepped cells.

The first stepped cells or the second stepped cells are created at intersections of word lines and bit lines when viewed horizontally.

A write and read circuit of the non-volatile memory is configured as a bit line pre-charge circuit for a write operation to pre-charge a bit line to a VPP voltage that is a programming voltage, or configured as a global bit line pre-charge circuit for a read operation to include a transistor for pre-charging a global bit line to a voltage of 0 V.

A programming operation method of the non-volatile memory comprises maintaining unselected word lines at a voltage of 0 V, and applying a VPP voltage that is a programming voltage to unselected bit lines or pre-charging the unselected bit lines to the VPP voltage in advance to be brought into a floating state; increasing a voltage applied to a word line from the voltage of 0 V to the VPP voltage that is a programming voltage such that a forward voltage is applied to a diode of a memory cell selected by the word line, and applying the voltage of 0 V to a bit line to program a memory cell selected by the bit line in memory cells selected by the word line; and applying the VPP voltage that is a programming voltage to the bit line or pre-charging the bit line to the VPP voltage in advance to be brought into a floating state in order to prevent the memory cell selected by the bit line from being programmed in the memory cells selected by the word line.

According to another aspect of the present invention, there is provided a manufacturing method of a highly integrated programmable non-volatile memory, comprising: forming trenches in one direction in a semiconductor substrate corresponding to locations where second stepped cells are to be formed; forming sidewall spacers at sidewalls of the trenches; forming diffusion regions by self-alignment; forming first stepped cells on a surface of the semiconductor substrate; forming the second stepped cells on bottom surfaces of the trenches; and forming a first electrode of the first stepped cells and the second stepped cells, wherein each of the first stepped cells and the second stepped cells is configured to have one of a stack structure including a conductive layer (first electrode), a variable resistor, a metal layer (second electrode) and a semiconductor layer, a stack structure including a conductive layer (first electrode), a variable resistor and a semiconductor layer (second electrode), a stack structure including a conductive layer (first electrode), an insulating layer, a metal layer (second electrode) and a semiconductor layer, and a stack structure including a conductive layer (first electrode), an insulating layer and a semiconductor layer (second electrode).

A plurality of memory cells are manufactured by ion implantation using self-alignment through the sidewall spacers and stepped structure.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

The detailed description of the embodiment of the present invention corresponds to, in fact, a simple example of the present invention and is not intended to restrict the present invention, or the application and use of the present invention. Further, there is no intention to be bound by any theory included in the aforementioned technical field, description of the related art and summary, and the following detailed description.

Hereinafter, embodiments of the present invention will be described in detail with reference to the accompanying drawings.

The present invention may be applied to a bulk silicon wafer or a semiconductor substrate including thin films of silicon on an insulation layer (generally, silicon-on-insulator, i.e., SOI).

In the following description, it is defined that the data '1' is stored in a state where there is no resistive path in an oxide layer used as an antifuse, and data '0' is stored in a state where there is a resistive path in the oxide layer, and vice versa, but the present invention is not limited thereto.

With regard to write and read circuits and operations, the following description will be made using a 2-bit data bus such as bit lines BL0 and BL1, global bit lines GBL0 and GBL1, write data input signals WD0 and WD1, and read data output signals RD0 and RD1 to simply explain the embodiment of the present invention, but the present invention is not limited thereto.

Figure 1:
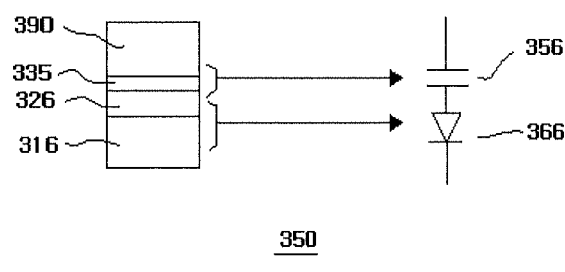
FIG. 1 illustrates a cross-sectional view of an antifuse element in a non-programmed state according to the conventional technology, and an equivalent circuit thereof.
Figure 2:
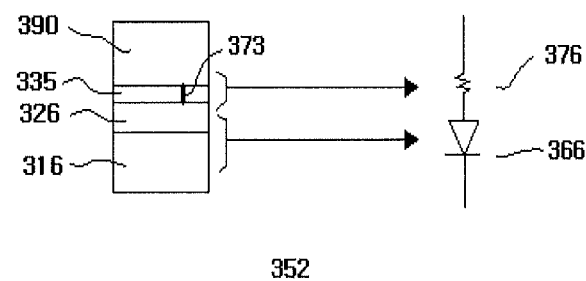
FIG. 2 illustrates a cross-sectional view of an antifuse element in a programmed state according to the conventional technology, and an equivalent circuit thereof.

A memory cell according to the conventional technology is shown in FIGS. 1 and 2. The memory cell is formed to have a stack structure including a conductive layer 390, an insulating layer 335, a metal layer 326, and a semiconductor layer 316.

FIG. 1 illustrates a cross-sectional view of the memory cell in a non-programmed state, and an equivalent circuit thereof. As shown in FIG. 1, a thin insulating layer 335 is deposited between a first electrode 390 formed of a conductor and a second electrode 326 formed of metal, thereby forming a capacitor 356.

Further, as shown in FIG. 1, the second electrode 326 formed of metal is in contact with a diffusion region 316 doped with P-type or N-type dopants in low concentration, thereby forming a Schottky diode 366.

Further, the memory cell may be configured to have a stack structure including a conductive layer 390, an insulating layer 335 and a semiconductor layer 326 and 316 as shown in FIG. 1. Further, the semiconductor layer may include a P-N diode structure formed by joining a P-type/N-type diffusion region and a N-type/P-type diffusion region. The example shown in FIG. 1 corresponds to a case where the semiconductor layer is formed as a P-N diode 366 formed by joining the P-type diffusion region 326 and the N-type diffusion region 316.

FIG. 2 illustrates a state where the insulating layer 335 has been programmed in the example of FIG. 1. As shown in FIG. 2, a resistive path 373 is created in the insulating layer 335 such that the state is changed from an insulating state to a conducting state.

Figure 3:
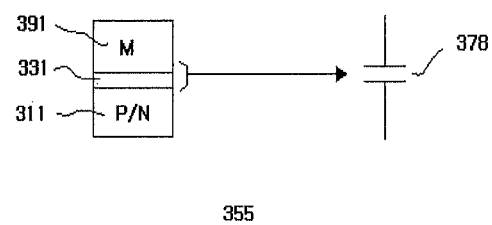
FIG. 3 illustrates a cross-sectional view of an antifuse element in a non-programmed state according to the conventional technology, and an equivalent circuit thereof.
Figure 4:
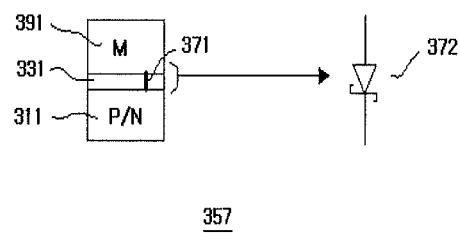
FIG. 4 illustrates a cross-sectional view of an antifuse element in a programmed state according to the conventional technology, and an equivalent circuit thereof.

Another memory cell according to the conventional technology is illustrated in FIGS. 3 and 4. The memory cell is configured to have a stack structure including a metal layer, an insulating layer, and a semiconductor layer.

FIG. 3 illustrates a cross-sectional view of the memory cell in a non-programmed state, and an equivalent circuit thereof. As shown in FIG. 3, a thin insulating layer 331 is deposited between a first electrode 391 formed of metal and a second electrode 311 formed of a low concentration doped semiconductor, thereby electrically forming a capacitor 378.

FIG. 4 illustrates a cross-sectional view of a state where the insulating layer 331 has been programmed in the example of FIG. 3, and an equivalent circuit thereof.

As shown in FIG. 4, a resistive path 371 is created in the insulating layer 331 such that the state is changed from an insulating state to a conducting state. Accordingly, since the first electrode 391 and the second electrode 311 has a structure in which the metal is in contact with the semiconductor, it is switched to a Schottky diode 372.

In programming memory cells 350, a sufficiently high voltage is applied to an antifuse of an insulating layer such that a breakdown occurs in the antifuse to create a resistive path. In the following description, the high voltage is defined as a VAF voltage, and an example in which the insulating layer is formed of an oxide layer will be described.

The VCC voltage is generally set such that the electric field applied to the gate oxide layer is about 5 MV/cm, and it is preferable that the electric field required to cause a gate breakdown in the gate oxide layer is about 20 MV/cm.

For example, if the thickness of the gate oxide layer is 2.3 nm in a process in which the length of the gate is 130 nm, it is preferable that the VCC voltage is about 1.2 V, and the VAF voltage which may cause the gate breakdown is about 5 V.

Thus, in the above example, it is preferable that the VPP voltage for programming is about 5.3 V.

Figure 5:
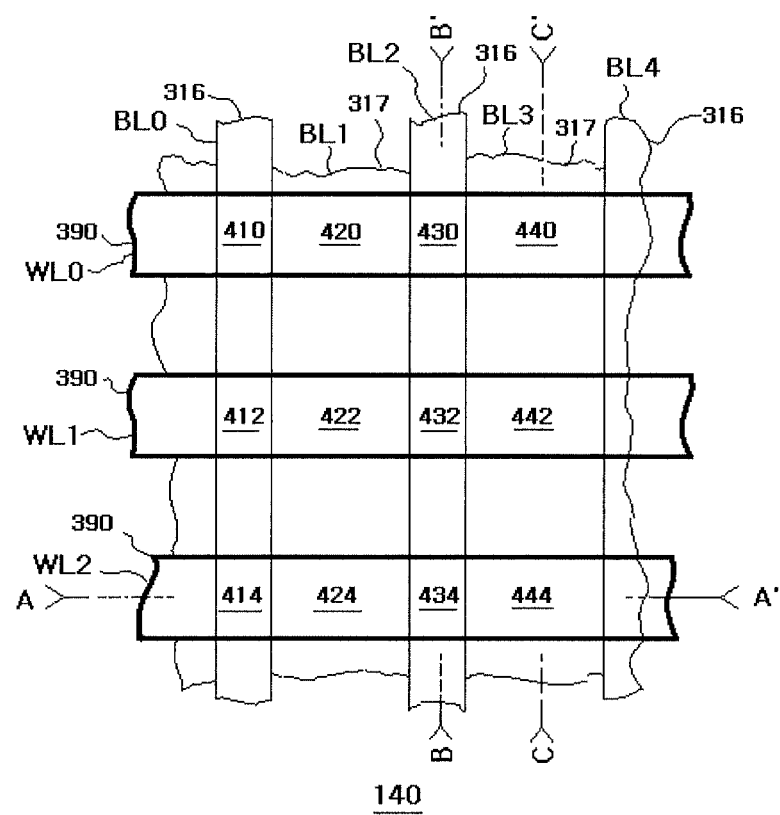
FIG. 5 illustrates a layout of a memory array according to the present invention.

FIG. 5 illustrates a layout of a memory array 140 in accordance with the embodiment of the present invention.

In FIG. 5, a portion of the memory array is illustrated, and memory cells are arranged in rows and columns to have a matrix structure.

The present invention provides an operation method and a peripheral circuit for driving a memory array including a plurality of memory cells.

As described above, in the embodiment of the present invention, word and bit lines are connected in a forward direction to the diode of the memory cell.

There are two methods to connect the word and bit lines to the memory cell. That is, in one method, the word and bit lines may be connected in a forward direction to the diode previously formed in the memory cell or the diode to be formed in the memory cell. In the other method, the word and bit lines may be connected in a backward direction to the diode.

The memory cell has a structure in which when the antifuse is changed from the insulating state to the conducting state, it is switched to the diode connection, wherein both electrodes are connected to the word and bit lines respectively. The embodiment of the present invention will be described using a method of connecting the word and bit lines in the forward direction. Since a backward connection method is complementary to the forward connection method, it can be easily changed.

As shown in FIG. 5, word lines WL0, WL1 and WL2 extend in the horizontal direction, and bit lines BL0, BL1, BL2 and BL3 extend in the vertical direction. Memory cells are formed at intersections 410, 420, 430, 440, 412, 422, 432, 442, 414, 424, 434 and 444 of the word lines and the bit lines.

According to the embodiment of the present invention, since the neighboring bit lines have a vertical spacing, when viewed on the plane, the bit lines are adjacent to each other without a horizontal spacing as in the conventional case.

Thus, since the memory cells are adjacent to each other without a horizontal spacing, the integration density is increased.

Figure 6:
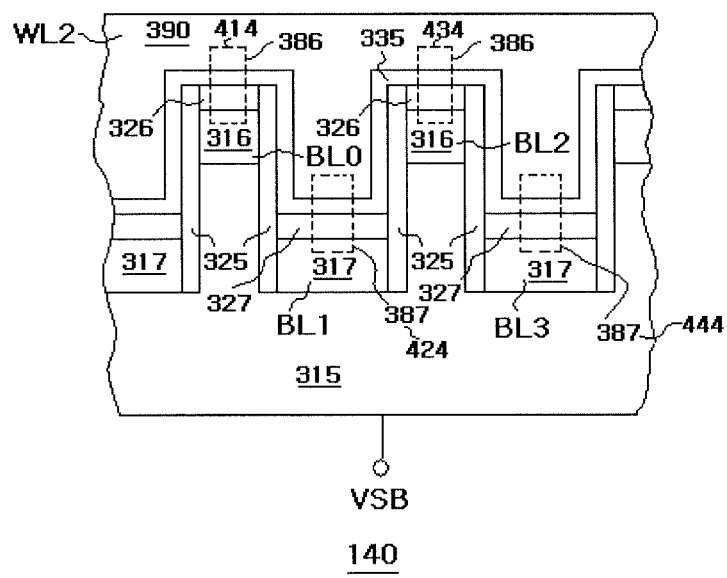
FIG. 6 illustrates a cross-sectional view of the memory array according to the present invention, which is taken along line A-A' of FIG. 5.

FIG. 6 illustrates a cross-sectional view of the memory array 140, which is taken along line A-A' of FIG. 5. That is, FIG. 6 is a cross-sectional view obtained by cutting the memory array 140 in the extending direction of the word line WL2 in FIG. 5.

As shown in FIG. 6, a semiconductor substrate 315 is a P-type substrate, which is connected to a VSB.

Further, trenches are repeatedly formed in the semiconductor substrate 315 at regular intervals to provide memory cells including diffusion regions 316 and 317 with different heights.

The diffusion regions 316 and 317 are doped with N-type dopants in low concentration. The second electrode 326 and 327 of silicide or metal is deposited thereon, thereby forming the Schottky diode.

As shown in FIG. 6, an oxide layer serving as an insulating layer is deposited on the second electrode 326 and 327, and the first electrode 390 formed of polycrystalline silicon or metal is stacked on the oxide layer. The first electrode 390 is connected to the word line WL2.

In FIG. 6, portions corresponding to first stepped cells 386 and second stepped cells 387 are separately represented by dotted lines. The diffusion regions 316 are respectively connected to the bit lines BL0 and BL2. Further, the diffusion regions 317 are respectively connected to the bit lines BL1 and BL3.

The memory cells formed at the intersections 414, 424, 434 and 444 of the word line WL2 and the bit lines BL0, BL1, BL2 and BL3 as shown in FIG. 5 are illustrated in the cross-sectional view of FIG. 6.

At the intersections 414 and 434 of the word line WL2 and the bit lines BL0 and BL2 in FIG. 5, as shown in FIG. 6, the first stepped cells 386 including the diffusion regions 316 are formed on the surface of the semiconductor substrate 315.

Further, at the intersections 424 and 444 of the word line WL2 and the bit lines BL1 and BL3 in FIG. 5, as shown in FIG. 6, the second stepped cells 387 including the diffusion regions 317 are formed on the bottom surfaces of the trenches.

That is, according to the embodiment of the present invention, the first stepped cells are formed on the surface of the semiconductor substrate, and the second stepped cells are formed on the bottom surfaces of the trenches.

Specifically, as shown in FIG. 6, sidewall spacers 325 are formed at sidewalls of the first stepped cells 386 and the second stepped cells 387 in order to prevent interference due to the insulating layer 335 interposed between the first electrode 390 and the semiconductor substrate 315 and suppress generation of parasitic transistors in the region between the first stepped cells 386 and the second stepped cells 387.

This is because a resistive path may be created in the insulating layer 335 interposed between the first electrode 390 and the semiconductor substrate 315 in the programming operation, thereby causing the leakage current.

Even in the case where the insulating layer is formed of a variable resistor, the insulating layer may be interposed between the first electrode 390 and the semiconductor substrate 315 to cause the leakage current.

Further, this is because the first electrode 390 becomes a gate, the insulating layer 335 becomes a gate oxide layer, and the diffusion regions 316 and 317 become source and drain regions, so that it can act as a MOS transistor.

In the above example, a case where the first stepped cells and the second stepped cells have a stack structure including the conductive layer (first electrode), the insulating layer, the metal layer (second electrode) and the semiconductor layer has been described. However, the first stepped cells and the second stepped cells may have a stack structure including the conductive layer (first electrode), the insulating layer, and the semiconductor layer (second electrode). Further, the semiconductor layer may include a P-N junction diode structure. When described with reference to FIG. 6, it may have a stack structure including the conductive layer 390, the insulating layer 335 and the semiconductor layer 326 and 316. The semiconductor layer may be configured to include a P-N diode formed by joining a P-type/N-type diffusion region 326 and a N-type/P-type diffusion region 316.

Figure 7:
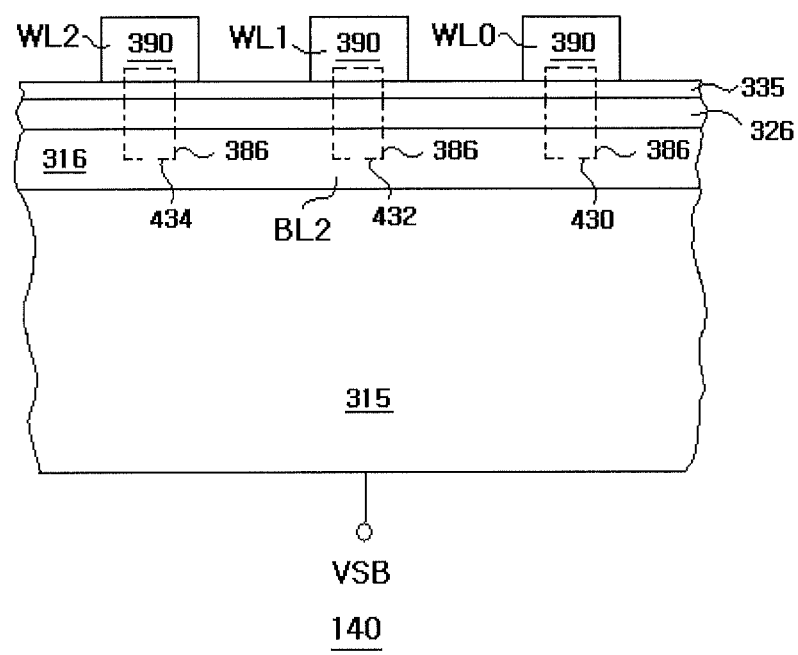
FIG. 7 illustrates a cross-sectional view of the memory array according to the present invention, which is taken along line B-B' of FIG. 5.

FIG. 7 illustrates a cross-sectional view of the memory array 140 in accordance with the embodiment of the present invention, which is taken along line B-B' of FIG. 5.

That is, FIG. 7 is a cross-sectional view obtained by cutting the memory array 140 in the extending direction of the bit line BL2 in FIG. 5.

As shown in FIG. 7, it is a portion where the trenches are not formed, and there are only the first stepped cells 386 formed on the surface of the semiconductor substrate 315. The portions corresponding to the first stepped cells 386 are separately represented by dotted lines in FIG. 7.

The memory cells formed at the intersections 430, 432 and 434 of the bit line BL2 and the word lines WL0, WL1 and WL2 as shown in FIG. 5 are illustrated in the cross-sectional view of FIG. 7.

At the intersections, as shown in FIG. 7, the first stepped cells 386 including the diffusion regions 316 are formed on the surface of the semiconductor substrate 315 at a height higher than the second stepped cells.

Figure 8:
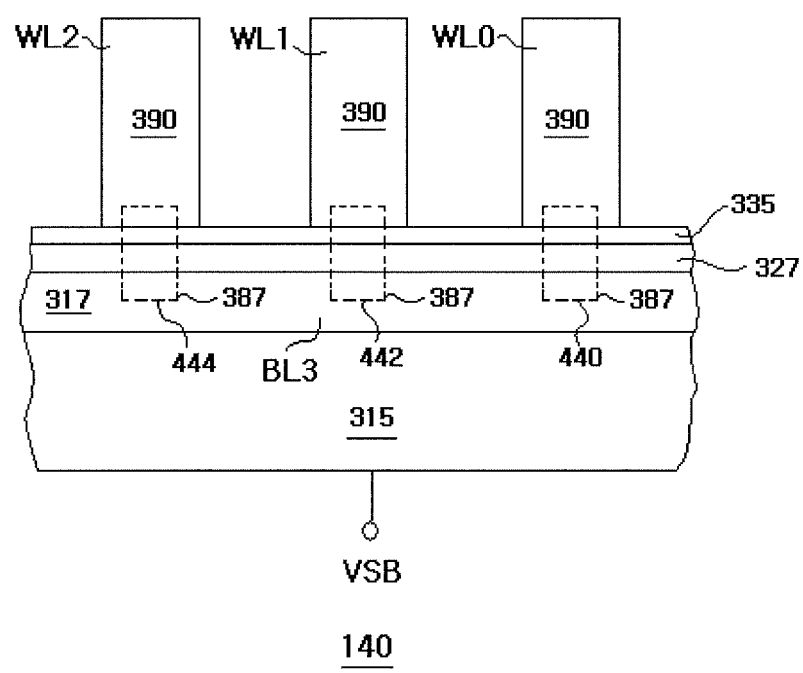
FIG. 8 illustrates a cross-sectional view of the memory array according to the present invention, which is taken along line C-C' of FIG. 5.

FIG. 8 illustrates a cross-sectional view of the memory array 140 in accordance with the embodiment of the present invention, which is taken along line C-C' of FIG. 5.

That is, FIG. 8 is a cross-sectional view obtained by cutting the memory array 140 in the extending direction of the bit line BL3 in FIG. 5.

As shown in FIG. 8, it is a portion where the trenches are formed, and there are only the second stepped cells 387 formed on the bottom surfaces of the trenches. The portions corresponding to the second stepped cells 387 are separately represented by dotted lines in FIG. 8.

The memory cells formed at the intersections 440, 442 and 444 of the bit line BL3 and the word lines WL0, WL1 and WL2 in FIG. 5 are illustrated in FIG. 8.

At the intersections, as shown in FIG. 8, the second stepped cells 387 including the diffusion regions 317 are formed on the bottom surfaces of the trenches to have a height lower than the first stepped cells, i.e., a height lower than the surface of the semiconductor substrate 315.

Figure 9:
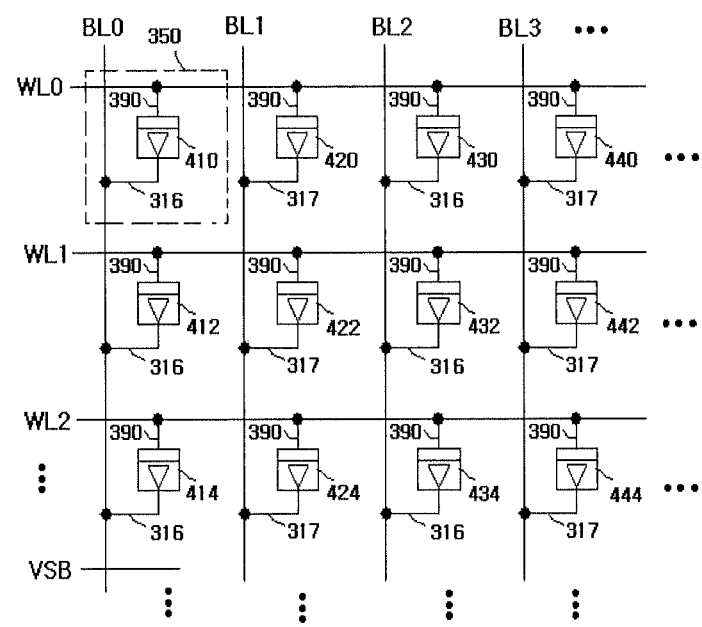
FIG. 9 illustrates a circuit of the memory array according to the present invention.

FIG. 9 illustrates a circuit of the memory array 140 in accordance with the embodiment of the present invention. Here, in order to facilitate the understanding, the memory cells are illustrated as arbitrary symbols including the antifuses and the diodes.

As described above, the memory cells 350 are formed at the intersections of the word lines and the bit lines.

As shown in FIG. 9, the memory array 140 is integrated such that a plurality of memory cells 350 are arranged in a matrix structure.

As shown in FIG. 9, the bit lines of the memory cells are connected to the bit lines of the other memory cells and arranged in columns to form a bit line bus (BL0, BL1, BL2, . . . ).

The bit line bus is connected to a global bit line bus (GBL0, GBL1, GBL2, . . . ) by selection of a column decoder to send/receive data to/from read and write circuits.

As shown in FIG. 9, the respective word lines of the memory cells are connected to the word lines of the other memory cells and arranged in rows to form a word line bus (WL0, WL1, WL2, WL3, WL4, . . . ). The word lines are connected to an output terminal of a row decoder and selected by the row decoder.

The bodies of the memory cells 350 are P-wells to be shared with the other memory cells 350 and are in common connected to the VSB.

In the memory array 140 in accordance with the embodiment of the present invention, data is stored by programming the antifuse forming the memory cell selected in the word and bit lines. It is programmed in the word line selected by the row decoder according to the electrical state of the bit line selected by the column decoder.

According to the embodiment of the present invention, the data '1' is stored in a state where there is no resistive path in the antifuse that is an oxide layer of the memory cell 350 in the memory array, and the data '0' is stored in a state where there is a resistive path in the antifuse.

Accordingly, initially, the data '1' is stored in all antifuses. In order to store data '0', it is required to create a resistive path in the antifuse that is an oxide layer of the selected memory cell 350. On the contrary, in order to store data '1', even though the memory cell 350 is selected by the word and bit lines, it is required to prevent a resistive path from being created in the antifuse that is an oxide layer of the selected memory cell 350. That is, it is required to prevent programming To this end, a VPP voltage is applied to the selected bit line, or the selected bit line is set in a floating state.

In the programming operation according to the embodiment of the present invention, when the word line is selected, the VPP voltage is applied to the selected word line, and the VCC voltage is applied to unselected word lines.

Figure 10:
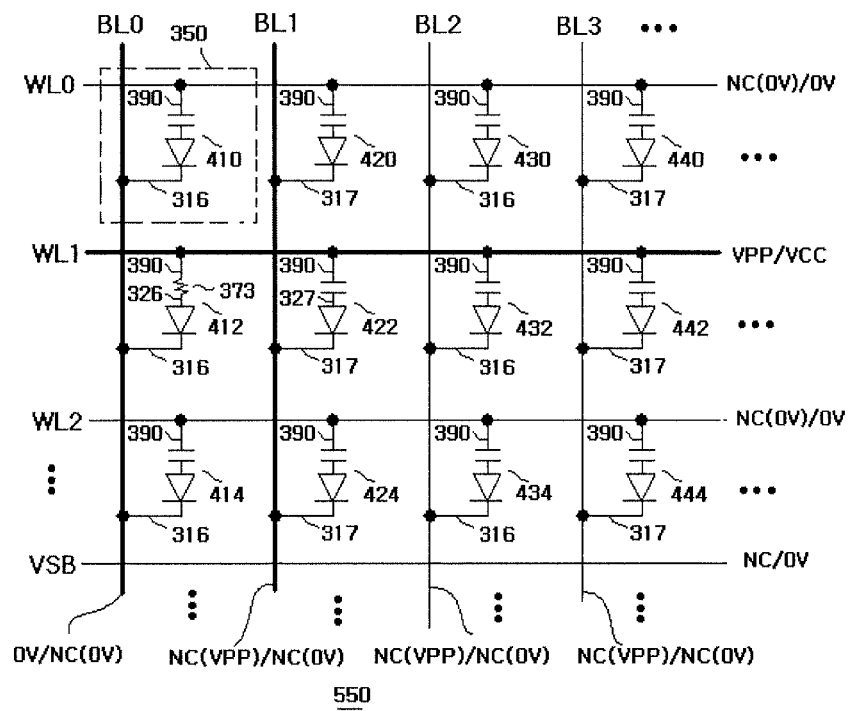
FIG. 10 is a diagram for explaining a programming and read operation of the memory array according to the present invention.

As shown in FIG. 10, a case where a programming operation is performed in a memory array 550 will be described as an example.

FIG. 10 illustrates an equivalent circuit after programming in FIG. 9. In FIG. 10, it is assumed that the memory cell is configured to have a series structure of the antifuse and the diode. Accordingly, the antifuse is illustrated as a capacitor if it is in the insulating state, and illustrated as a resistor if it is in the conducting state.

In FIG. 10, a case where the word line WL1 and the bit lines BL0 and BL1 are selected (represented by bold lines to facilitate the understanding) is illustrated as an example.

In this example, the data '0' is stored in the memory cell 412 selected by the word line WL1 and the bit line BL0, and the data '1' is stored in the memory cell 422 selected by the word line WL1 and the bit line BL1.

In the programming operation, the unselected word lines are maintained at the VCC voltage, and the voltage of the selected word line WL1 is increased from the VCC voltage to the VPP voltage. Further, the VSB is set to have a voltage of 0 V, or is set in the floating state.

The unselected bit lines BL2, BL3, . . . are set to have the VPP voltage or set in the floating state such that a forward voltage is not applied to the diode of the memory cell.

Here, it is required to store the data '0' through the bit line BL0 and store the data '1' through the bit line BL1. Accordingly, a voltage of 0 V is applied to the bit line BL0 to store the data '0', and the VPP voltage is applied to the bit line BL1 or the bit line BL1 is set in the floating state to store the data '1'.

The VPP voltage is applied to the selected word line WL1, and a voltage of 0 V is applied to the bit line BL0. As shown in FIG. 10, the VPP voltage is applied to both terminals of the memory cell 412 selected by the word line WL1 and the bit line BL0 such that the diode of the memory cell is in the conducting state.

Accordingly, the second electrode 326 of the memory cell 412 may have a diode threshold voltage of, e.g., 0.2 to 0.3 V.

Eventually, a high voltage obtained by subtracting the diode threshold voltage from the VPP voltage is applied between the first electrode 390 and the second electrode 326 of the memory cell 412. In the above-described example relating to the VPP voltage, since the VPP voltage is about 5.3 V, the VAF voltage becomes about 5 V.

Thus, a breakdown occurs to create a resistive path in the antifuse that is an oxide layer interposed therebetween. That is, it is programmed to the data '0'.

On the other hand, in case of the memory cell 422 selected by the word line WL1 and the bit line BL1, since the bit line BL1 is in the floating state regardless of the word line WL1, even if the diode of the memory cell 422 is in the conducting state, the second electrode 327 of the memory cell 422 is in the floating state similarly to the bit line BL1.

Accordingly, even in the state where the VPP voltage is applied to the word line WL1 connected to the first electrode 390 in the memory cell 422, a high voltage is not applied between the first electrode 390 and the second electrode 327, and a breakdown cannot occur in the antifuse that is an oxide layer interposed therebetween, so that a resistive path is not created. That is, programming is prevented. In other words, since the initial storage state can be maintained, the data '1' is stored.

Figure 11:
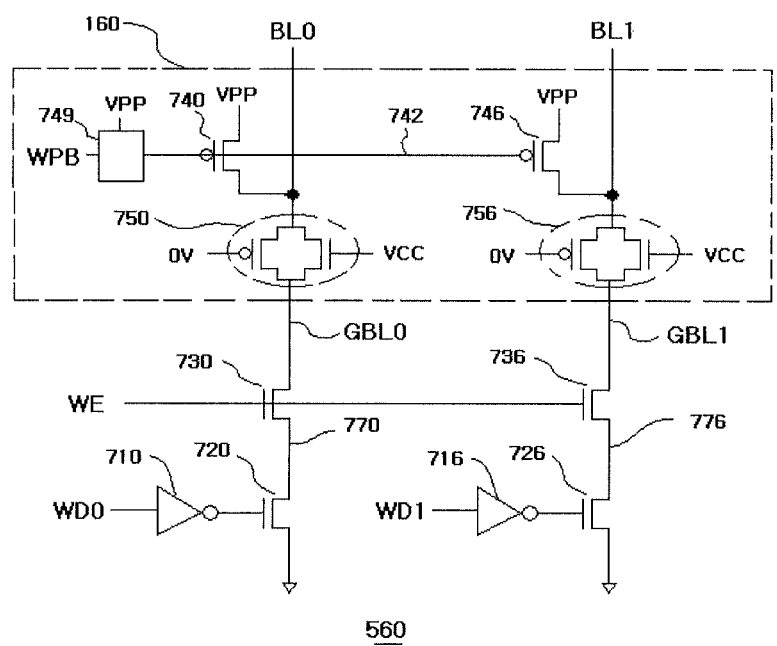
FIG. 11 illustrates a write circuit and a portion of a column decoder for transmitting data to the memory array according to the present invention.

The selected bit lines BL0 and BL1 include the column decoder and the write circuit, and serve as a path to which the data required for the programming operation is inputted. FIG. 11 illustrates a portion of the column decoder and the write circuit.

As shown in FIG. 11, a case where the bit lines BL0 and BL1 and the global bit lines GBL0 and GBL1 are selected through transmission gates 750 and 756 that are selected and controlled by a column decoder 160 will be described as an example.

Accordingly, as shown in FIG. 11, the VCC voltage and the voltage of 0 V are applied to the transmission gates 750 and 756 such that the channels of the transmission gates 750 and 756 selected by the column decoder 160 are in the conducting state. The column decoder 160 includes transistors 740 and 746 for pre-charging the bit lines BL0 and BL1 to the VPP voltage, and the transistors 740 and 746 are controlled by a WPB signal.

The global bit lines GBL0 and GBL1 have the voltage of 0 V or the floating state according to the data and the control of the write circuit.

As shown in FIG. 11, WD0 and WD1 are write data input signals to allow the global bit lines GBL0 and GBL1 to have the voltage of 0 V for programming or the floating state for preventing programming through inverters 710 and 716, pull-down transistors 720 and 726 and pass transistors 730 and 736.

When described in connection with the embodiment in which the memory array is programmed, the data '0' is stored through the bit line BL0 and the data '1' is stored through the bit line BL1.

Accordingly, WL0 is a data input signal having a logic level '0' and WD1 is a data input signal having a logic level '1'.

According to the present invention, since it is necessary to prevent the bit line BL0 or BL1 from being programmed, it is preferable that it is switched to the floating state from the VPP voltage.

Accordingly, since the global bit lines GBL0 and GBL1 need to be pre-charged to the VPP voltage, the WPB has a logic level '0' before selecting the word line WL1 during a write cycle in the programming mode.

Figure 12:
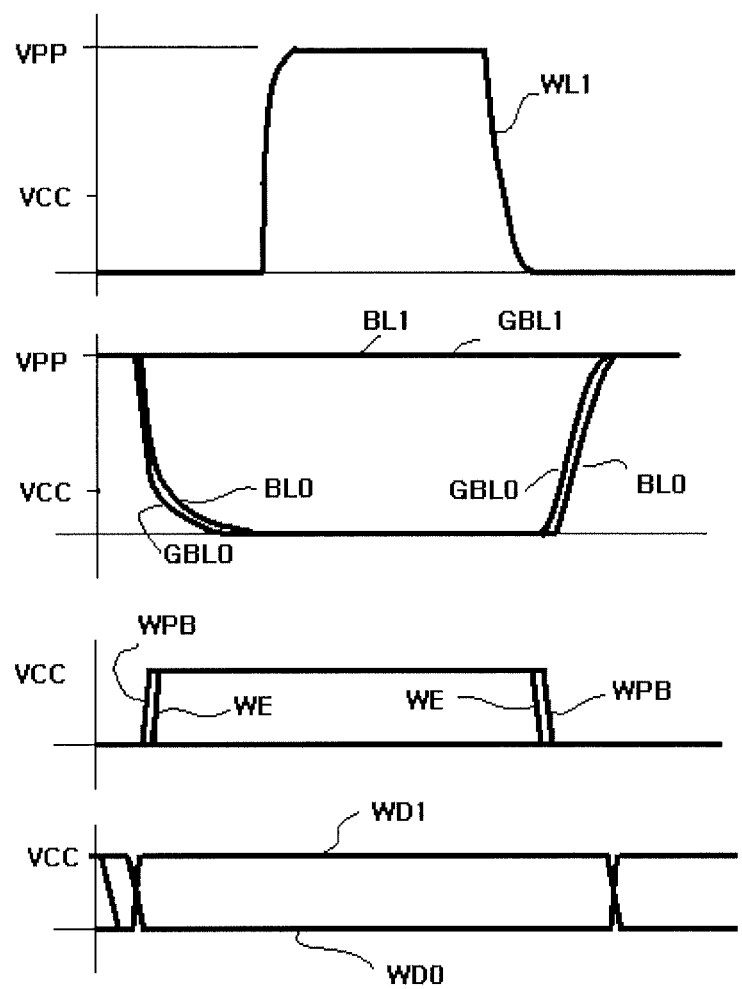
FIG. 12 is a timing diagram showing programming of data in a memory device according to the present invention.

In this regard, FIG. 12 illustrates a write cycle timing 570. Since the WD0 has a logic level '0', a drain 770 of the pull-down transistor 720 has the voltage of 0 V through the inverter 710. Since the WD1 has a logic level '1', a drain 776 of the pull-down transistor 726 has the floating state through the inverter 716.

Subsequently, as shown in FIG. 12, since the WPB has a logic level '1', a gate 742 of the bit line pre-charge transistors 740 and 746 has the VPP voltage through a level shifter 749 in FIG. 11, and the pre-charging of the bit lines BL0 and BL1 is completed.

Subsequently, the WE becomes a logic level '1' immediately. Accordingly, the channel of the pass transistors 730 and 736 is in the conducting state such that the global bit line GBL0 and the bit line BL0 have the voltage of 0 V and the global bit line GBL1 and the bit line BL1 have the floating state.

As shown in FIG. 12, when the word line WL1 is selected such that the VPP voltage is applied to the word line WL1 and the voltage of 0 V is applied to the bit line BL0, the diode of the memory cell 412 is in the conducting state.

Accordingly, the diode threshold voltage of the second electrode 326 of the memory cell 412 becomes 0.2 to 0.3 V, and a high voltage is applied to the antifuse that is an oxide layer between the first electrode 390 and the second electrode 326 so that a breakdown occurs to create a resistive path. That is, it is programmed and the data '0' is stored. Further, the diode of the memory cell 422 is connected to the bit line BL1, and it remains in the floating state even though the charges move between them so that a breakdown does not occur in the antifuse that is an oxide layer between the first electrode 390 and the second electrode 327 to prevent the programming, and the data '1' is stored.

Subsequently, as shown in FIG. 12, the word line WL1 has the VCC voltage. Then, the WE becomes the logic level '0' and the WPB becomes the logic level '0'. The bit line pre-charge transistors 740 and 746 are in the conducting state through the level shifter 749, and the bit lines BL0 and BL1 are pre-charged to the VPP voltage again. Consequently, the write cycle operation is completed.

It is possible to verify whether the programming has been performed successfully by performing the read cycle after the write cycle operation. The programming can be surely performed by repeating the write and read operations and defects can be processed by limiting the number of repetitions.

Reading the data stored in the memory cell is performed by determining the presence or absence of the resistive path. That is, the storage state of the memory cell selected by the word line is transmitted to the selected bit line, it is changed to digital data by a sense amplifier capable of sensing and amplifying the electrical state of the bit line BL.

A case where a read operation is performed in the memory array 550 as shown in FIG. 10 will be described as an example.

Further, for example, it is assumed that a resistive path is formed in the antifuse that is an oxide layer between the first electrode 390 and the second electrode 326 of the memory cell 412 such that the data '0' is stored therein, and a resistive path is not formed in the antifuse that is an oxide layer between the first electrode 390 and the second electrode 327 of the memory cell 422 such that the data '1' is stored therein.

In order to facilitate the understanding, as shown in FIG. 10, there is illustrated an equivalent circuit in which the resistive path 373 is formed in the case where the data '0' is stored.

As shown in FIG. 10, the resistive path 373 is illustrated as a resistor, which is connected between the first electrode 390 and the second electrode 326 of the memory cell 412 in which the data '0' is stored. Accordingly, the stored data is determined as '0' in the read operation that will be described later.

As shown in FIG. 10, the word line WL1, the bit line BL0 and the bit line BL1 are selected.

Further, the VCC voltage is applied to the unselected bit lines BL2, BL3, . . . according to the embodiment of the present invention.

Further, the voltage of 0 V is applied to the VSB and the unselected word lines WL0, WL2, WL3, . . . according to the embodiment of the present invention.

According to the present invention, before the word line WL1 is selected and has the VCC voltage, the bit lines BL0 and BL1 need to be pre-charged to the voltage of 0 V in advance. When the word line WL1 is selected and has the VCC voltage, the word line WL1 is in the conducting state through the resistive path 373 and the diode connected to the bit line BL0. Accordingly, the bit line BL0 has a voltage lower by the diode threshold voltage than the VCC voltage applied to the word line WL1.

Further, when the word line WL1 has the VCC voltage, the diode connected to the bit line BL1 is connected in series to the second electrode 327 of the memory cell 422 and can be in the conducting state by coupling.

Even in this case, although charges move between the bit line BL1 and the second electrode 327 of the memory cell 422, since the parasitic capacitance of the bit line BL1 is relatively much larger than that of the second electrode 327, the voltage hardly changes at all, and becomes a voltage similar to the voltage of 0 V, to which it is pre-charged in advance, in the floating state.

Figure 13:
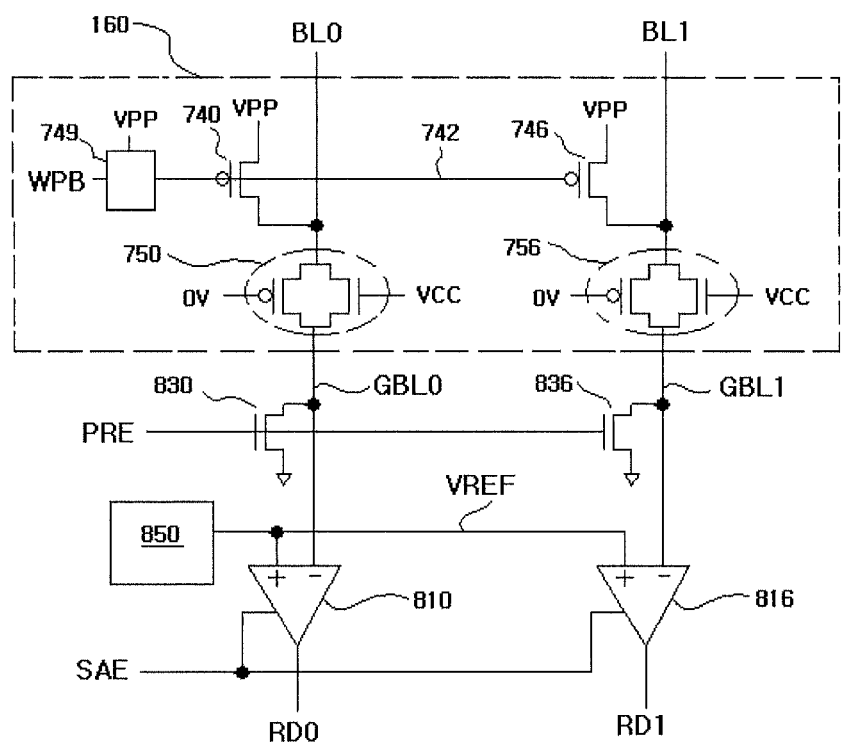
FIG. 13 illustrates a read circuit and a column decoder showing a case of reading the stored data by a sense amplifier according to the present invention.

FIG. 13 is a circuit diagram for reading the data stored in the memory cell in accordance with the embodiment of the present invention.

According to the embodiment of the present invention, as shown in FIG. 13, the bit lines BL0 and BL1 are connected to the global bit lines GBL0 and GBL1 through the column decoder 160 and are selected by column decoding.

As shown in FIG. 13, since the column decoder 160 is used in common with the write circuit 170, the column decoder 160 is not a separately added circuit, and illustrated to facilitate the understanding of the read circuit.

In a global bit line pre-charge circuit according to the present invention, there are transistors 830 and 836 for pre-charging the global bit lines GBL0 and GBL1 to the voltage of 0 V, and sense amplifiers 810 and 816 for reading the stored data by transmitting the electrical state of the bit lines BL0 and BL1 to the global bit lines GBL0 and GBL1.

As shown in FIG. 13, in the embodiment of the present invention, the sense amplifiers 810 and 816 are operated when the SAE has a logic level '1' such that a voltage difference between the reference voltage VREF and the voltage of the input signals GBL0 and GBL1 is amplified and latched to be outputted to the output terminals RD0 and RD1.

As a circuit for the sense amplifiers 810 and 816, a latch type sense amplifier may be preferably used. Since the sense amplifier is previously well-known, a detailed description thereof will be omitted.

In FIG. 13, if the stored data is '0', the input signals GBL0 and GBL1 of the sense amplifiers 810 and 816 are changed from the voltage of 0 V to the voltage of 'VCC-Vd (diode threshold voltage)', and if the stored data is '1', they are maintained at the voltage of 0 V almost without changing.

Accordingly, the reference voltage VREF may be a half value of 'VCC-Vd (diode threshold voltage)', but it may be a smaller value for high-speed operation.

A case where the reference voltage VREF is a voltage of 0.2 V in FIG. 13 according to the embodiment of the present invention will be described as an example. The reference voltage VREF is provided from a VREF generator 850.

If the SAE becomes the logic level '1', the sense amplifier is operated. If the GBL0 is greater than 0.2 V, GBL0 is less than the reference voltage VREF and the RD0 becomes the logic level '0', and if the GBL0 is less than 0.2 V, the RD0 becomes the logic level '1'.

Figure 14:
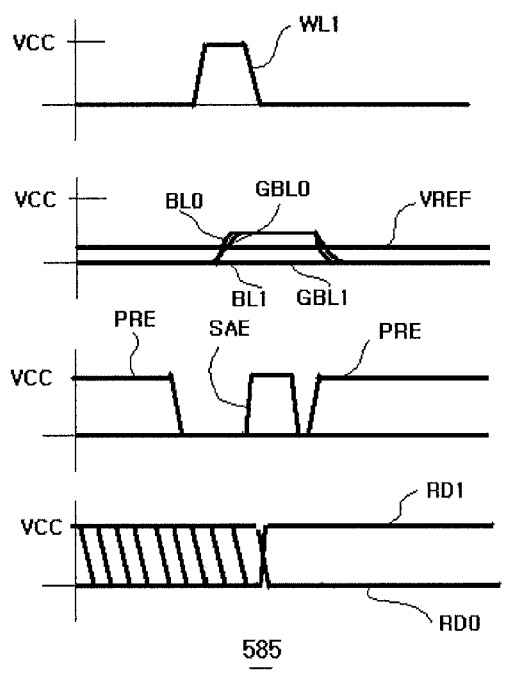
FIG. 14 is a timing diagram showing reading of the stored data in the memory device according to the present invention.

In connection with the read operation, the read cycle timing is illustrated in FIG. 14. Before the word line WL1 is selected and becomes the logic level '1', the PRE becomes the logic level '1' and the global bit lines GBL0 and GBL1 are pre-charged to the voltage of 0 V by the pre-charge transistors 830 and 836.

The word line WL1 is selected and the VCC voltage is applied to the word line WL1. The bit line BL0 is pre-charged to the voltage of 0 V, and has the floating state.

In the memory cell 412 connected to the word line WL1 and the bit line BL0, since the resistive path 373 created in the antifuse is connected in series to the diode, and a forward voltage is applied to the diode, the current flows and the voltage of the bit line BL0 increases.

Eventually, the voltage of the bit line BL0 and the global bit line GBL0 increases to the voltage of 'VCC-Vd (diode threshold voltage)' obtained by decreasing the voltage by the diode threshold voltage while the word line WL1 is selected. In the embodiment of the present invention, it is assumed that the global bit line GBL0 increases to a voltage of 0.5 V.

When the word line WL1 is selected and the VCC voltage is applied thereto, since there is no resistive path in the memory cell 422 connected to the word line WL1 and the bit line BL1, after the antifuse is charged, the current does not flow in the diode.

Although charges may move through the diode between the bit line BL1 and the second electrode 327 of the memory cell 422, since the parasitic capacitance of the bit line BL1 is relatively much larger than that of the second electrode, the voltage of the bit line BL1 and the global bit line GBL1 becomes a voltage similar to the voltage of 0 V without large change.

As shown in FIG. 14, when the SAE becomes the logic level '1', by the sense amplifier 810, since the global bit line GBL0 has a voltage of 0.5 V, which is greater than the reference voltage VREF that is a voltage of 0.2 V, the RD0 is latched to the logic level '0' and outputted. Also, by the sense amplifier 816, since the global bit line GBL1 has a voltage of 0 V, which is less than the reference voltage VREF that is a voltage of 0.2 V, the RD0 is latched to the logic level '1' and outputted.

Subsequently, the word line WL1 becomes the voltage of 0 V, and the SAE becomes the logic level '0'. Accordingly, the operations of the sense amplifiers 810 and 816 are completed. As shown in FIG. 14, the PRE becomes the logic level '1', and the global bit lines GBL0 and GBL1 are pre-charged to the voltage of 0 V again. Accordingly, the read cycle operation is finished.

Figure 15:
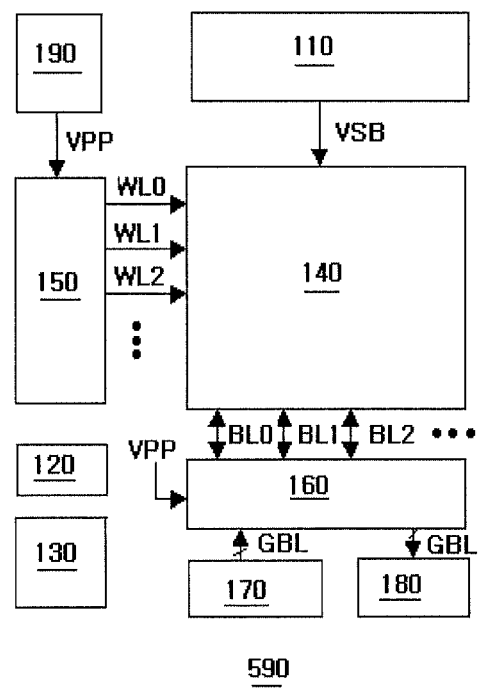
FIG. 15 illustrates an entire memory configuration according to the present invention.

An entire configuration of a memory device in accordance with the embodiment of the present invention is illustrated in FIG. 15. The configuration will be described in brief.

The memory device includes the memory array 140 described above, and a VSB supplier 110 which generates the VSB that is required for the memory array 140.

Further, a VPP generator 190 is provided to generate the VPP and supply the VPP to a row decoder 150 and the column decoder 160.

Further, it includes the row decoder 150 for selecting the word line and the column decoder 160 for selecting the bit line in the memory array 140.

As shown in FIG. 15, the row decoder 150 and the column decoder 160 receive an address bus from an input/output unit 130 and are controlled by a controller 120 to decode the address.

The row decoder 150 receives the VPP voltage from the VPP generator 190 because it requires the VPP voltage for the programming operation. The column decoder 160 includes a pre-charge circuit for pre-charging the bit line to the VPP voltage such that the bit line is in the floating state in order to prevent the programming.

There is provided a write circuit 170 required for the data write operation. The write circuit 170 receives a data bus from the input/output unit 130 and transmits it to the GBL that is the global bit line bus (GBL0, GBL1, GBL2, . . . ) under control of the controller 120.

As shown in FIG. 15, there is provided a read circuit 180 for the data read operation. The stored data is transmitted to the GBL that is the global bit line bus (GBL0, GBL1, GBL2, . . . ), and the sense amplifier senses and amplifies the electrical state of the GBL and changes it into a digital signal to be transmitted to the input/output unit 130.

The input/output unit 130 interfaces the outside with the inside. The controller 120 receives commands required for the write and read operations, which have been supplied to the input/output unit 130, and interprets the commands in detail to control the related circuit.

The configuration of the memory device in accordance with the embodiment of the present invention may be modified. Accordingly, without being limited to the one-time programmable (OTP) memory device, it may be alternatively embodied to include a fuse in the redundancy repair used in various semiconductor memory devices such as DRAM and SRAM.

A method for manufacturing a memory array in which a plurality of memory cells are arranged in rows and columns in accordance with the embodiment of the present invention largely includes, in order to form a plurality of memory cells, forming trenches to be arranged repeatedly at first stepped cell intervals, forming sidewall spacers at sidewalls of the trenches, forming diffusion regions to be self-aligned, forming first stepped cells on a surface of a semiconductor substrate, forming second stepped cells on bottom surfaces of the trenches, and forming a first electrode of the first stepped cells and the second stepped cells.

Figure 16:
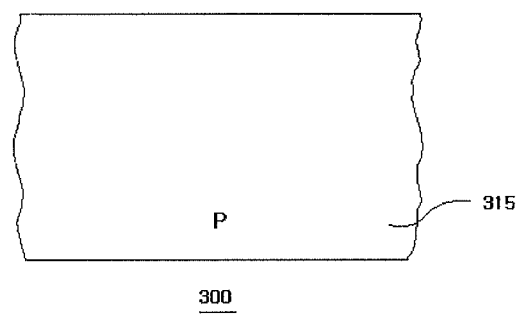
FIG. 16 is a cross-sectional view showing a step of providing a semiconductor substrate to manufacture the memory array according to the present invention.

Specifically, first, as shown in FIG. 16, the semiconductor substrate 315 is provided.

The embodiment of the present invention will be described using the structure shown in FIG. 1 as an example. The structure shown in FIG. 1 is used as an example in order to explain the manufacturing method to include the structure shown in FIG. 3. Further, although the diode structure illustrated as an example in this case is a Schottky diode, since it can be easily modified into a P-N diode, the description using the P-N diode as an example will not be given.

The semiconductor substrate 315 is typically doped with P-type or N-type dopants. In the embodiment of the present invention, the description will be made using a P-type doped semiconductor substrate as an example.

Figure 17:
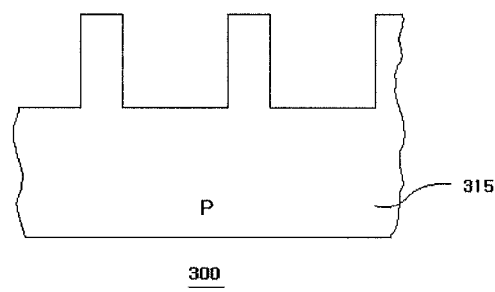
FIG. 17 is a cross-sectional view showing a step of forming trenches to manufacture the memory array according to the present invention.

When the semiconductor substrate 315 is provided, as shown in FIG. 17, the trenches for forming the second stepped cells 387 are formed. The trenches are repeatedly arranged in columns at intervals corresponding to the width of the first stepped cells 386 such that the first stepped cells 386 are formed between the neighboring trenches. The second stepped cells 387 are formed on the bottom surfaces of the trenches. It is preferable that the depth of the trenches is two times or more the depth of the diffusion regions since the diffusion regions 316 of the first stepped cells are sufficiently isolated from the diffusion regions 317 of the second stepped cells.

Figure 18:
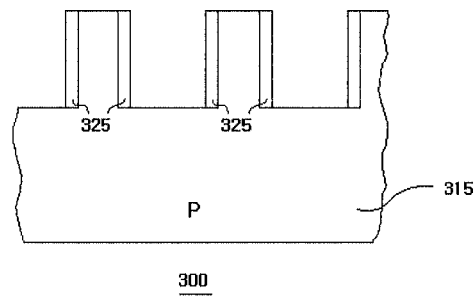
FIG. 18 is a cross-sectional view showing a step of forming sidewall spacers to manufacture the memory array according to the present invention.

Subsequently, the sidewall spacers 325 are formed at the sidewalls of the trenches as shown in FIG. 18.

Figure 19:
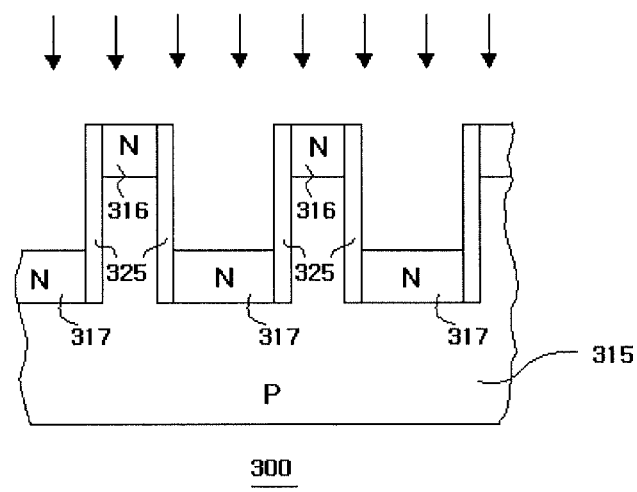
FIG. 19 is a cross-sectional view showing ion implantation to manufacture the memory array according to the present invention.

Then, as shown in FIG. 19, after forming single crystalline silicon for the diffusion regions 317 of the second stepped cells, the N-type dopants are doped in low concentration, thereby forming the diffusion regions 316 and 317. As well-known, in the method for forming single crystalline silicon, an amorphous silicon or polycrystalline silicon layer is formed at the locations where the diffusion regions 317 of the second stepped cells will be formed, i.e., the bottom surfaces of the trenches. Then, the amorphous silicon or polycrystalline silicon layer is changed into a single crystalline silicon layer by using a solid phase epitaxial growth method, thereby forming the single crystalline silicon. The change into the single crystalline silicon layer can be made by irradiating laser light instead of the solid phase epitaxial growth method.

Since the diffusion regions 316 and 317 are formed by self-alignment, they are formed on the memory array by ion implantation as shown by arrows without distinction between the first stepped cells 386 and the second stepped cells 387.

Such self-alignment is made because the trench structure and the sidewall spacers 325 of the trenches serve as a mask.

As shown in FIG. 19, the diffusion regions 316 formed in the surface of the semiconductor substrate 315 become a semiconductor layer forming the first stepped cells 386 as shown in FIGS. 6 and 7.

Further, the diffusion regions 317 formed in the bottom surfaces of the trenches become a semiconductor layer forming the second stepped cells 387 as shown in FIGS. 6 and 8.

Figure 20:
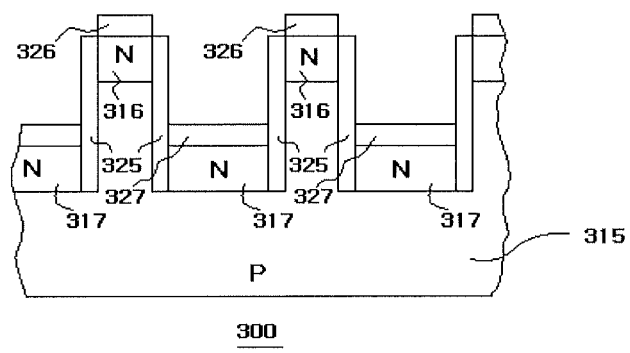
FIG. 20 is a cross-sectional view showing a step of forming silicide to manufacture the memory array according to the present invention.

Subsequently, as shown in FIG. 20, silicide or metal is deposited on the diffusion regions 316 and 317 as the second electrode 326 and 327 of the thin oxide layer 335.

After depositing the silicide or metal on the diffusion regions 316 and 317, patterning is performed by using photolithography and etching.

The second electrode 326 and 327 and the diffusion regions 316 and 317 form a Schottky diode having the structure shown in FIG. 1. In case of forming a Schottky diode having the structure shown in FIG. 3, the silicide or metal is not necessary, and the diffusion regions 316 and 317 become the second electrode of the oxide layer 335.

Figure 21:
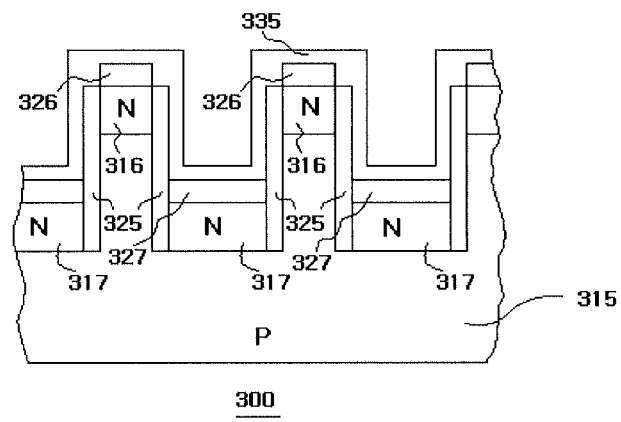
FIG. 21 is a cross-sectional view showing a step of forming an insulating layer to manufacture the memory array according to the present invention.

Subsequently, as shown in FIG. 21, the thin oxide layer 335 is deposited or thermally grown. The thickness of the oxide layer needs to be small in order to reduce the VPP voltage. It may be preferable that it is similar to the thickness of the gate oxide layer of the thin oxide layer transistor in order to simplify the manufacturing process.

Figure 22:
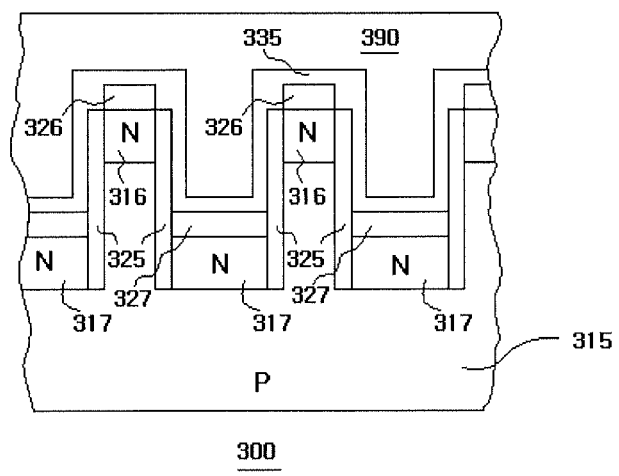
FIG. 22 is a cross-sectional view showing a step of depositing metal to manufacture the memory array according to the present invention.

Then, as shown in FIG. 22, silicide, metal or polycrystalline silicon is formed on the thin oxide layer 335 as the first electrode 390 of the thin oxide layer 335. That is, silicide, metal or polycrystalline silicon is deposited on the thin oxide layer 335 and patterned by using photolithography and etching.

The first electrode 390 may be a conductor connected to the word line or bit line according to the connection method.

Figure 23:
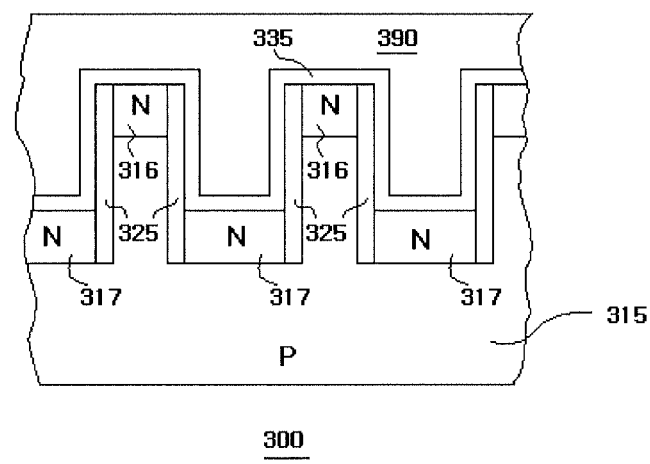
FIG. 23 is a cross-sectional view showing a case where the steps except the step of forming silicide are performed to manufacture the memory array according to the present invention.

FIG. 23 is a cross-sectional view of a case where the steps except the step of forming silicide or metal deposited as the second electrode in FIG. 20 are performed in accordance with the embodiment of the present invention. Thus, in FIG. 23, the second electrode becomes the diffusion regions 316 and 317.

When the thin oxide layer 335 is brought into the conducting state in FIG. 23, in order to form the Schottky diode with the second electrode 326 and 327, the first electrode 390 should be deposited using silicide or metal instead of polycrystalline silicon.

Figure 24:
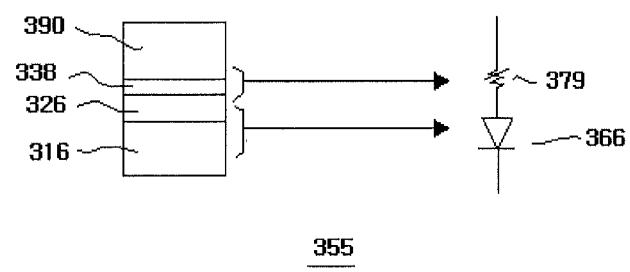
FIG. 24 illustrates a cross-sectional view of a memory cell according to the conventional technology, and an equivalent circuit thereof.

The memory cell according to the conventional technology is illustrated in FIG. 24. The memory cell is formed to have a stack structure including a conductive layer, a variable resistor, a metal layer, and a semiconductor layer. A case where an intermediate layer between the first electrode 390 and the second electrode 326 is formed of a variable resistor 338 in the memory cell has been illustrated in FIG. 24. That is, FIG. 24 illustrates a cross-sectional view of a B-type memory cell and an equivalent circuit thereof.

As shown in FIG. 24, the variable resistor 338 is deposited between the first electrode 390 formed of a conductive layer, and the metal layer 326 formed of metal, thereby forming a variable resistor element 379.

Further, as shown in FIG. 24, the second electrode 326 formed of metal is in contact with the diffusion region 316 doped with P-type or N-type dopants in low concentration, thereby forming a Schottky diode 366.

Further, the memory cell may be configured, as shown in FIG. 24, to have a stack structure including the conductive layer 390, the variable resistor 338, and the semiconductor layer 326 and 316. Further, the semiconductor layer may include a P-N diode structure formed by joining a P-type/N-type diffusion region and a N-type/P-type diffusion region. The example shown in FIG. 24 corresponds to a case where the semiconductor layer is formed as the P-N diode 366 formed by joining the P-type diffusion region 326 and the N-type diffusion region 316.

Figure 25:
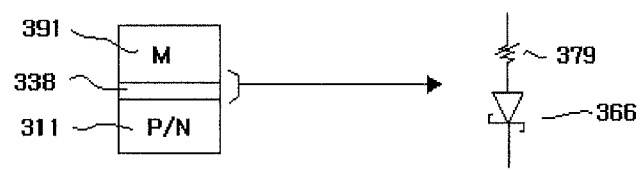
FIG. 25 illustrates a cross-sectional view of a memory cell according to the present invention, and an equivalent circuit thereof.

The memory cell according to the present invention is illustrated in FIG. 25. The memory cell is formed to have a stack structure including a metal layer, a variable resistor, and a semiconductor layer. A case where an intermediate layer between the first electrode 390 and the second electrode 311 is formed of the variable resistor 338 in the memory cell has been illustrated in FIG. 25. That is, FIG. 25 illustrates a cross-sectional view of a B-type memory cell and an equivalent circuit thereof.

As shown in FIG. 25, the variable resistor 338 is deposited between the first electrode 391 formed of metal and the second electrode 311 formed of a low concentration doped semiconductor.

That is, it becomes a Schottky diode electrically including a variable resistor element. As shown in FIG. 25, it can be represented by an equivalent circuit in which the variable resistor element 379 and the Schottky diode 366 are connected in series.

The memory array including the B-type memory cell is similar to the memory array including the A-type memory cell. Accordingly, the manufacturing method of the B-type memory array is also similar to the manufacturing method of the A-type memory array. That is, in the manufacturing method of the memory array, when forming the first stepped cells and the second stepped cells, a variable resistor having a predetermined thickness is deposited as an intermediate layer instead of the insulating layer.

Since there is no difference between the above-described memory array manufacturing method and other manufacturing methods, a detailed description of other manufacturing methods will be omitted to avoid redundancy.

Further, in a non-volatile memory device including the A-type or B-type memory cell an operation method thereof, the A-type and the B-type are similar to each other.

In the A-type, unlike the B-type, the intermediate layer serving as a storage place, i.e., the insulating layer does not have a resistance that can be changed from a low state to a high state as in the variable resistor. The other configuration is similar. The above-described embodiment of the circuit and operation of the memory device is related to the A-type, and can be easily changed to an embodiment of the B-type. Accordingly, a repeated description will be omitted for simplicity.

For example, the VPP voltage which is a programming voltage is a voltage at which the resistive path is created in the insulating layer. The VPP voltage changes the resistance of the insulating layer from a high state to a low state.

Similarly, in the variable resistor, a set voltage changes the resistance of the variable resistor from a high state to a low state.

Accordingly, the VPP voltage serving as a programming voltage may be modified to a set voltage for the variable resistor. The programming can be performed by a method similar to the method of the A-type.

Further, the VPP voltage serving as a programming voltage may be modified to a reset voltage for the variable resistor. It is possible to change the resistance of the variable resistor from a low state to a high state, i.e., a state before programming.

The principle of reading the stored data is to determine the magnitude of the resistance of the variable resistor or the insulating layer. The read operation or circuit of the B-type is similar to that described above.

As the variable resistor, a resistance change material, a phase change material, or other materials having memory characteristics through stable implementation of two resistor states may be used.

As the resistance change material, various materials such as perowvskite, transition metal oxide, and chalcogenide may be used. The resistance change material changes its electrical resistance to a low-resistance state or high-resistance state by a constant voltage. The resistance change material may include any one of binary transition metal oxides such as $TiO_2$, $NiO$, $HfO_2$, $Al_2O_3$, $ZrO_2$, $ZnO$, $Ta_2O_5$ and $Nb_2O_5$, and ternary transition metal oxides such as $SrTiO_3$, HfAlO, HfSiO and HfTiO, or a combination thereof. Further, the resistance change material may include any one of Cu-doped $SiO_2$, Ag-doped $SiO_2$, Cu-doped Ge—Se—Te compounds, Ag-doped Ge—Se—Te compounds, and CuOx-based resistance change materials, or a combination thereof.

The phase change material is a material whose phase is changed to a crystalline or amorphous state by a constant current, and chalcogenide compounds are used as the phase change material. The phase changeable chalcogenide compounds may include binary compounds, ternary compounds, and quaternary compounds consisting of a combination of Ge, Te, Sb, In, Se and Sn, and these compounds doped with Bi. Preferably, the phase change material may include $Ge_2Sb_2Te_5$, $Ge_2Sb_2Te_5$ doped with nitrogen, oxygen, $SiO_2$ or $Bi_2O_3$, or a combination thereof.

According to the present invention, there are provided a memory device including the memory cells and an operation method thereof. Thus, it is possible to easily manufacture an appropriate memory device.

In addition, according to the present invention, a vertical isolation structure is formed between the neighboring memory cells, thereby reducing a distance between the memory cells. Thus, there is an advantage of increasing the integration density compared to the horizontal structure in the conventional technology.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A highly integrated programmable non-volatile memory comprising:
    first stepped cells and second stepped cells formed on a semiconductor substrate to have different heights,
    wherein each of the first stepped cells and the second stepped cells is configured to have one of a stack structure including a conductive layer (first electrode), a variable resistor, a metal layer (second electrode) and a semiconductor layer, a stack structure including a conductive layer (first electrode), a variable resistor and a semiconductor layer (second electrode), a stack structure including a conductive layer (first electrode), an insulating layer, a metal layer (second electrode) and a semiconductor layer, and a stack structure including a conductive layer (first electrode), an insulating layer and a semiconductor layer (second electrode), and
    wherein the first stepped cells are formed on a horizontal plane with a high height, and the second stepped cells are formed on a horizontal plane with a low height.

2. The highly integrated programmable non-volatile memory of claim 1, wherein the first stepped cells are formed on a surface of the semiconductor substrate, and the second stepped cells are formed on bottom surfaces of trenches.

3. The highly integrated programmable non-volatile memory of claim 1, wherein the first stepped cells and the second stepped cells are configured to be adjacent to each other, or a structure in which first stepped cells and the second stepped cells are adjacent to each other is repeated.

4. The highly integrated programmable non-volatile memory of claim 1, wherein sidewall spacers are formed at sidewalls between the first stepped cells and the second stepped cells in order to prevent interference due to the variable resistor or insulating layer interposed between the first electrode and the semiconductor substrate in the first stepped cells and the second stepped cells, or suppress generation of a parasitic transistor in a region between the first stepped cells and the second stepped cells.

5. The highly integrated programmable non-volatile memory of claim 1, wherein the first stepped cells or the second stepped cells are created at intersections of word lines and bit lines when viewed horizontally.

6. The highly integrated programmable non-volatile memory of claim 1, wherein in the stack structure including a conductive layer (first electrode), a variable resistor and a semiconductor layer (second electrode), or the stack structure including a conductive layer (first electrode), an insulating layer and a semiconductor layer (second electrode), the semiconductor layer may include a P-N junction diode structure.

7. The highly integrated programmable non-volatile memory of claim 1, wherein in the stack structure including a conductive layer (first electrode), a variable resistor and a semiconductor layer (second electrode), or the stack structure including a conductive layer (first electrode), an insulating layer and a semiconductor layer (second electrode), if the variable resistor or insulating layer is in a conducting state, the conductive layer and the semiconductor layer may become a Schottky diode structure.

8. The highly integrated programmable non-volatile memory of claim 1, wherein a write and read circuit of the non-volatile memory is configured as a bit line pre-charge circuit for a write operation to pre-charge a bit line to a VPP voltage that is a programming voltage, or configured as a global bit line pre-charge circuit for a read operation to include a transistor for pre-charging a global bit line to a voltage of 0 V.

9. The highly integrated programmable non-volatile memory of claim 1, wherein a programming operation method of the non-volatile memory comprises:
    maintaining unselected word lines at a voltage of 0 V, and applying a VPP voltage that is a programming voltage to unselected bit lines or pre-charging the unselected bit lines to the VPP voltage in advance to be brought into a floating state;
    increasing a voltage applied to a word line from the voltage of 0 V to the VPP voltage that is a programming voltage such that a forward voltage is applied to a diode of a memory cell selected by the word line, and applying the voltage of 0 V to a bit line to program a memory cell selected by the bit line in memory cells selected by the word line; and
    applying the VPP voltage that is a programming voltage to the bit line or pre-charging the bit line to the VPP voltage in advance to be brought into a floating state in order to prevent the memory cell selected by the bit line from being programmed in the memory cells selected by the word line.

10. A manufacturing method of a highly integrated programmable non-volatile memory, comprising:
    forming trenches in one direction in a semiconductor substrate corresponding to locations where second stepped cells are to be formed;
    forming sidewall spacers at sidewalls of the trenches;
    forming diffusion regions by self-alignment;
    forming first stepped cells on a surface of the semiconductor substrate;
    forming the second stepped cells on bottom surfaces of the trenches; and
    forming a first electrode of the first stepped cells and the second stepped cells,
    wherein each of the first stepped cells and the second stepped cells is configured to have one of a stack structure including a conductive layer (first electrode), a variable resistor, a metal layer (second electrode) and a semiconductor layer, a stack structure including a conductive layer (first electrode), a variable resistor and a semiconductor layer (second electrode), a stack structure including a conductive layer (first electrode), an insulating layer, a metal layer (second electrode) and a semiconductor layer, and a stack structure including a conductive layer (first electrode), an insulating layer and a semiconductor layer (second electrode).

11. The manufacturing method of claim 10, wherein a plurality of memory cells are manufactured by ion implantation using self-alignment through the sidewall spacers and stepped structure.

* * * * *